(12) United States Patent
Gill

(10) Patent No.: US 9,407,215 B2
(45) Date of Patent: Aug. 2, 2016

(54) CIRCUITS AND METHODS RELATED TO LOW-NOISE AMPLIFIERS HAVING IMPROVED LINEARITY

(71) Applicant: SKYWORKS SOLUTIONS, INC., Woburn, MA (US)

(72) Inventor: Bharatjeet Singh Gill, Ottawa (CA)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/274,663

(22) Filed: May 9, 2014

(65) Prior Publication Data

US 2014/0333384 A1    Nov. 13, 2014

Related U.S. Application Data

(60) Provisional application No. 61/822,242, filed on May 10, 2013.

(51) Int. Cl.
| | |
|---|---|
| H03G 3/12 | (2006.01) |
| H03F 3/195 | (2006.01) |
| H03F 3/193 | (2006.01) |
| H03F 1/02 | (2006.01) |
| H03F 1/32 | (2006.01) |
| H03F 3/24 | (2006.01) |

(52) U.S. Cl.
CPC .............. *H03F 3/195* (2013.01); *H03F 1/0205* (2013.01); *H03F 1/3205* (2013.01); *H03F 3/193* (2013.01); *H03F 3/245* (2013.01); *H03F 2200/108* (2013.01); *H03F 2200/294* (2013.01); *H03F 2200/451* (2013.01); *H03F 2200/489* (2013.01); *H03F 2200/492* (2013.01)

(58) Field of Classification Search
CPC . H03F 2200/451; H03F 3/193; H03F 3/2171; H03F 2203/21139; H03F 3/19; H03F 3/245; H03F 1/0205; H03F 1/223; H03F 1/565
USPC .......................................... 330/277, 283, 311
See application file for complete search history.

(56) References Cited

U.S. PATENT DOCUMENTS

| | | | | |
|---|---|---|---|---|
| 8,319,555 | B1 * | 11/2012 | Heikkinen et al. ............ | 330/283 |
| 2013/0314164 | A1 * | 11/2013 | Din et al. ...................... | 330/277 |
| 2014/0240048 | A1 * | 8/2014 | Youssef et al. ................ | 330/296 |

* cited by examiner

*Primary Examiner* — Khanh V Nguyen
(74) *Attorney, Agent, or Firm* — Chang & Hale LLP

(57) ABSTRACT

Disclosed are circuits and methods related to low-noise amplifiers (LNAs) having improved linearity. In some embodiments, a radio-frequency (RF) amplifier circuit can include a first amplifying transistor configured to amplify an RF signal. The RF amplifier circuit can further include a switchable inductance circuit that couples the first amplifying transistor to a signal ground. The switchable inductance circuit can be configured to be capable of providing at least two different inductance values that yield different linearity levels for the RF amplifier circuit. A high linearity performance can be obtained with a higher inductance and a lower bias voltage, thereby reducing power consumption of the RF amplifier. Examples of methods and devices related to such an RF amplifier circuit are disclosed.

20 Claims, 8 Drawing Sheets

CIRCUITS AND METHODS RELATED TO LOW-NOISE AMPLIFIERS HAVING IMPROVED LINEARITY

CROSS-REFERENCE TO RELATED APPLICATIONS

This application claims priority to U.S. Provisional Application No. 61/822,242 filed May 10, 2013, entitled CIRCUITS AND METHODS RELATED TO IMPROVED LINEARITY IN LOW-NOISE AMPLIFIERS, the disclosure of which is hereby expressly incorporated by reference herein in its entirety.

BACKGROUND

1. Field

The present disclosure generally relates to low-noise amplifiers (LNAs) for radio-frequency (RF) applications.

2. Description of the Related Art

In radio-frequency (RF) devices, an RF signal received by an antenna is typically amplified by a low-noise amplifier (LNA). Aside from a low noise figure, high linearity is a desirable feature in such an LNA.

SUMMARY

In some implementations, the present disclosure relates to a radio-frequency (RF) amplifier circuit that includes a first amplifying transistor configured to amplify an RF signal. The RF circuit further includes a switchable inductance circuit that couples the first amplifying transistor to a signal ground. The switchable inductance circuit is configured to be capable of providing at least two different inductance values that yield different linearity levels for the RF amplifier circuit.

In some embodiments, the first amplifying transistor can include a source, a drain and a gate. The first amplifying transistor can be configured to receive the RF signal at the gate and output the amplified RF signal at the drain. The switchable inductance circuit can couple the source of the first amplifying transistor to the signal ground.

In some embodiments, the RF amplifier circuit can be a low-noise amplifier (LNA) circuit. The switchable inductance circuit can include a first inductance connected electrically parallel with a switch. The switch can be capable of being in a closed state or an open state to provide two different inductance values for the switchable inductance circuit.

In some embodiments, the RF amplifier circuit can further include a second inductance connected in series with the switchable inductance circuit such that an overall inductance between the source of the first transistor and the signal ground is approximately equal to the second inductance when the switch is in the closed state and approximately equal to a sum of the first and second inductances when the switch is in the open state. The first and second inductances can be selected so that the LNA circuit operates in a normal linearity mode when the switch is in the closed state and a high linearity mode when the switch is in the open state.

In some embodiments, the RF amplifier circuit can further include a bias circuit. The bias circuit can include a variable current source configured to provide a bias voltage to the gate of the first transistor. The bias voltage can have a first magnitude and a second magnitude when the LNA circuit operates in the normal linearity mode and the high linearity mode, respectively. The second magnitude of the bias voltage can be lower than the first magnitude of the bias voltage while in the high linearity mode. Such a lower bias voltage decreases power consumption, and thereby increases battery life, while the high linearity performance is provided by increased inductance of the switchable inductance circuit.

In some embodiments, the RF amplifier circuit can further include a second amplifying transistor coupled to the drain of the first transistor. The first and second amplifying transistors can be connected and operated in a cascode configuration. In some embodiments, each of the first amplifying transistor and the second amplifying transistor can be a field-effect transistor (FET).

In accordance with a number of implementations, the present disclosure relates to a method for operating a radio-frequency (RF) amplifier circuit. The method includes providing an RF signal to a transistor to amplify the RF signal. The method further includes performing a switching operation that results in an inductance to change among a plurality of different values between the transistor and a signal ground. The different inductance value yield different linearity and gain levels for the RF amplifier circuit.

In some embodiments, the method can further include adjusting a bias voltage provided to the transistor to yield a selected bias voltage for each of the plurality of inductance values. A higher linearity level can correspond to an increased inductance value and a decreased bias voltage.

In a number of teachings, the present disclosure relates to a radio-frequency (RF) amplifier die that includes a substrate and a first amplifying transistor implemented on the substrate. The first transistor is configured to amplify an RF signal. The RF amplifier die further includes a switchable inductance circuit implemented on the substrate. The switchable inductance circuit is configured to couple the first amplifying transistor to a signal ground. The switchable inductance circuit is configured to be capable of providing at least two different inductance values that yield different linearity levels for the RF amplifier die.

In some embodiments, the substrate can include a silicon-on-insulator (SOI) substrate.

In a number of implementations, the present disclosure relates to a method for fabricating a die. The method includes providing a substrate, and implementing a low-noise amplifier (LNA) on the substrate. The LNA includes a transistor configured to amplify an RF signal. The method further includes forming a switchable inductance circuit. The switchable inductance circuit is capable of providing at least two different inductance values that yield different linearity levels for the LNA. The method further includes connecting the switchable inductance circuit between a source of the transistor and a signal ground.

In some teachings, the present disclosure relates to a radio-frequency (RF) module that includes a packaging substrate configured to receive a plurality of components. The RF module further includes a low-noise amplifier (LNA) implemented on a die. The die is mounted on the packaging substrate, and the LNA includes a transistor configured to amplify an RF signal. The RF module further includes a switchable inductance circuit that couples the transistor to a signal ground. The switchable inductance circuit is configured to be capable of providing at least two different inductance values that yield different linearity levels for the LNA.

In some embodiments, at least a portion of the switchable inductance circuit can also be implemented on the die.

In some implementations, the present disclosure relates to a radio-frequency (RF) device that includes an antenna configured to facilitate reception of an RF signal. The RF device further includes a module having a low-noise amplifier (LNA) in communication with the antenna. The LNA is configured to amplify the RF signal with a transistor. The module further includes a switchable inductance circuit that couples the transistor to a signal ground. The switchable inductance circuit is configured to be capable of providing at least two different inductance values that yield different linearity levels for the LNA. The RF device further includes a receiver circuit in communication with the LNA. The receiver circuit is configured to receive and process the amplified RF signal.

In some embodiments, the RF device can be a wireless device. In some embodiments, the wireless device can be a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
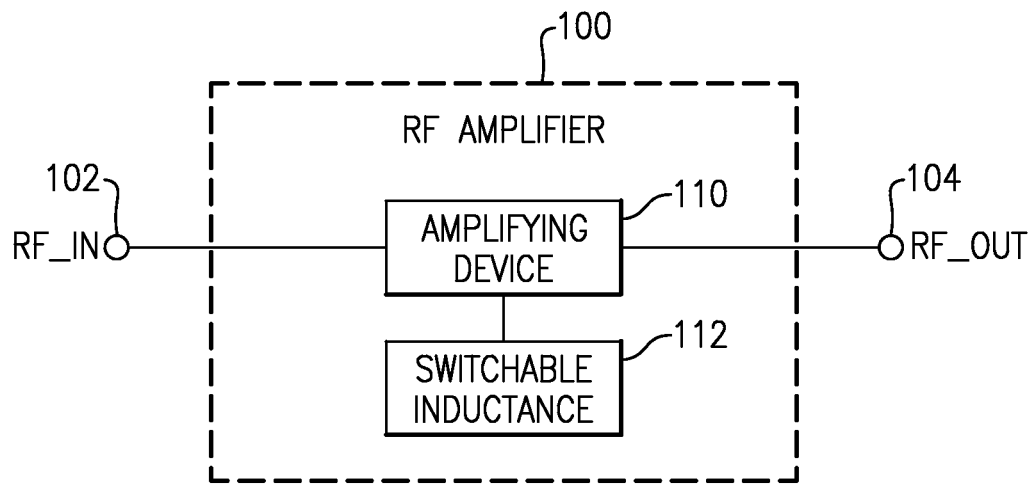
FIG. 1 depicts a radio-frequency (RF) amplifier having an amplifying device and a switchable inductance that can provide desirable functionalities such as improved linearity.

Described herein are circuits, devices and methods related to improved linearity performance in radio-frequency (RF) amplifiers such as low-noise amplifiers (LNAs). FIG. 1 shows a block diagram of an RF amplifier 100 configured to receive a radio-frequency (RF) signal at an input port 102 (RF_in), amplify the RF signal, and output the amplified RF signal at an output port 104 (RF_out). Such amplification of the RF signal can be performed by an amplifying device 110 such as an amplifying transistor.

As further shown in FIG. 1, the RF amplifier 100 can further include a switchable inductance circuit 112. As described herein, such an inductance can be advantageously switched on or off to provide desirable functionalities such as improved linearity performance of the RF amplifier 100. Although described in the context of improved linearity, it will be understood that one or more features of the present disclosure can also be configured to improve other operating parameters associated with RF amplifiers.

Figure 2:
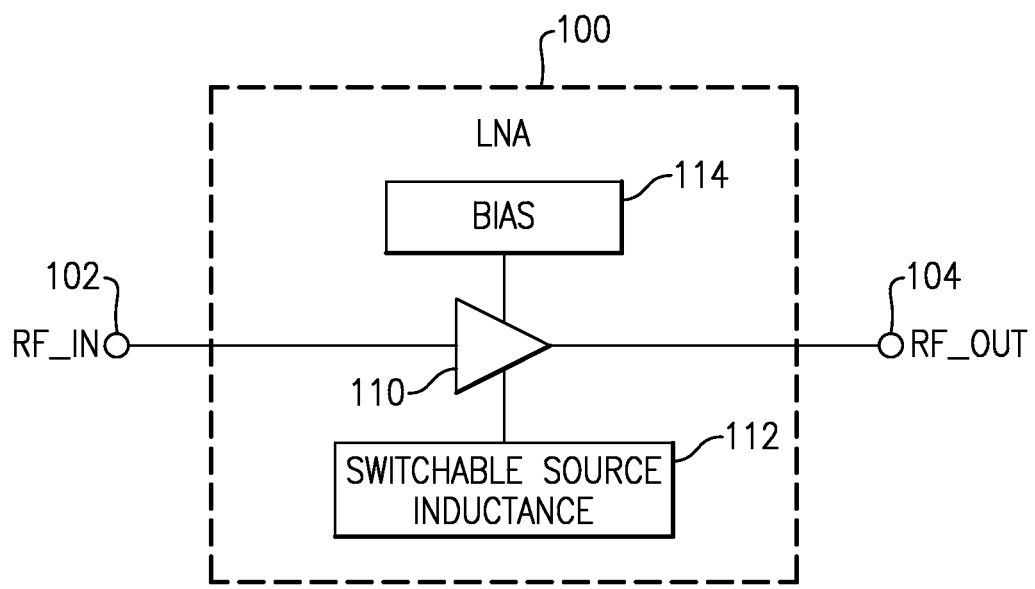
FIG. 2 shows that in some embodiments, the RF amplifier of FIG. 1 can be implemented as a low-noise amplifier (LNA).

FIG. 2 shows that in some embodiments, the RF amplifier 100 of FIG. 1 can be implemented as an LNA 100. As before, the LNA 100 can be configured to receive an RF signal at an input port 102 (RF_in), amplify the RF signal by an amplifying device 110, and output the amplified RF signal at an output port 104 (RF_out). In the context of LNAs, the amplifying device 100 can include transistors such as pseudomorphic high electron mobility transistor (pHEMT), silicon germanium (SiGe) transistor, heterojunction bipolar transistor (HBT), and complementary metal-oxide-semiconductor (CMOS) field-effect transistor (FET).

FIG. 2 further shows that in some embodiments, the amplifying device 110 can be coupled to or be provided with a switchable inductance circuit 112. As described herein by way of an example, such a switchable inductance circuit can be coupled to a source of an amplifying transistor of the amplifying device 110. An example of such a switchable inductance circuit and its coupling to the amplifying transistor is described herein in greater detail.

FIG. 2 further shows that in some embodiments, the amplifying device 110 can be coupled to or be provided with a bias circuit 114. Such a bias circuit can be configured to, for example, provide a bias signal (e.g., a bias voltage) to a gate of the amplifying transistor. In some embodiments, the bias circuit 114 can be operated in combination with the operation of the switchable inductance circuit 112. Examples of such operating configurations are described herein in greater detail.

Figure 3:
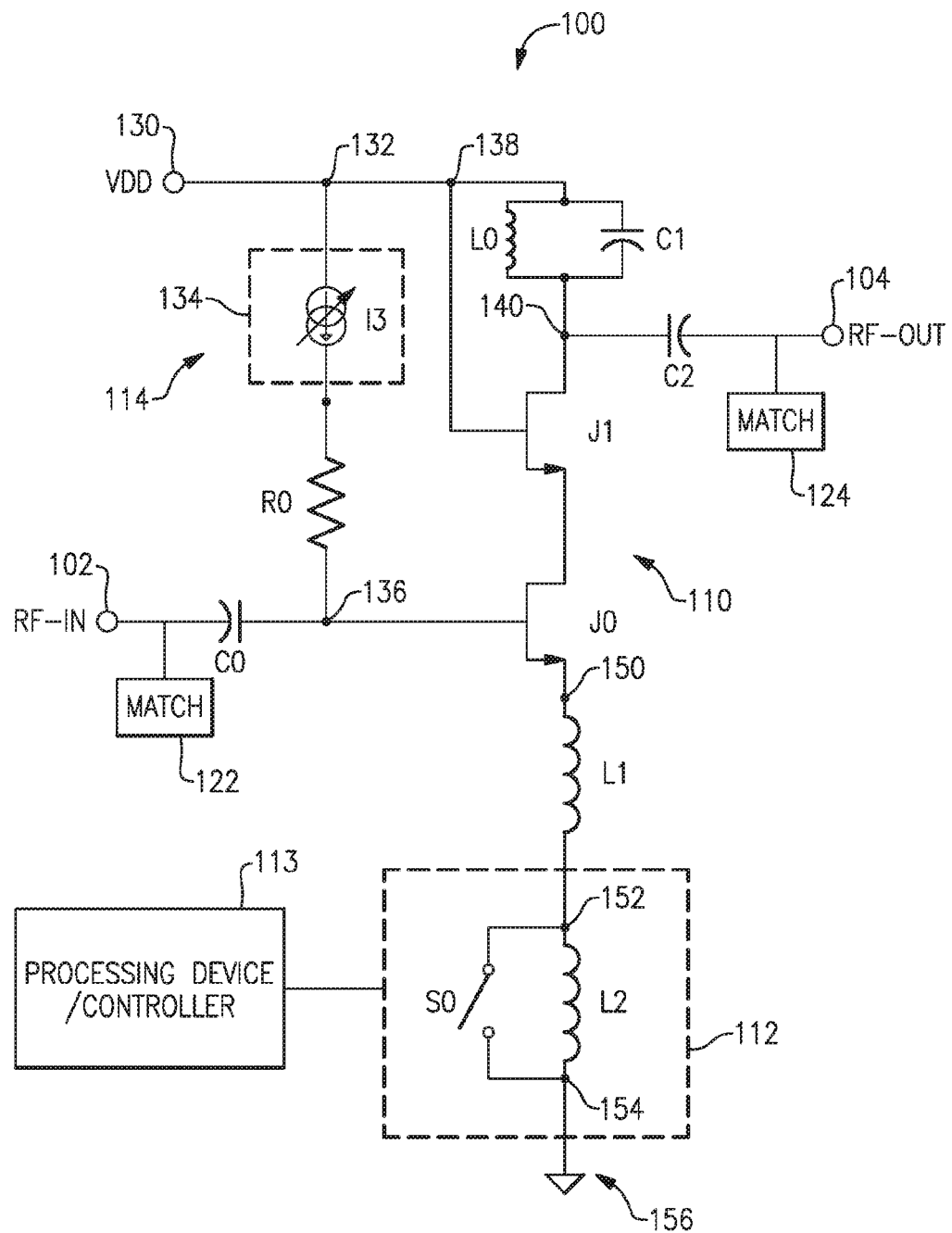
FIG. 3 shows an example LNA circuit having a switchable inductance couples a source of an amplifying transistor to a signal ground, as well as a bias circuit having a variable current source.

FIG. 3 shows an example configuration of an LNA circuit 100 that can be a more specific example of the LNA 100 of FIG. 2. In the example shown in FIG. 3, an RF signal can be received at an input terminal 102 (RF_in) and be provided to the gate of a field effect transistor (FET) J0 such as a silicon-on-insulator (SOI) CMOS FET. The input RF signal can undergo impedance matching by an input matching network 122. The input RF signal can also pass through, for example, a DC-block capacitor C0.

In the example of FIG. 3, the LNA circuit 100 is depicted as a cascode amplification configuration 110 having the FET J0 and a second FET J1. As previously described, the RF signal enters the first FET J0 at the gate and leaves through the drain. The RF signal then enters the source of the second FET J1 and leaves through the drain (node 140). Accordingly, the first FET J0 is operated as a common source device, and the second FET J1 is operated as a common gate device.

The RF signal amplified and output from the drain 140 of the second FET J1 is shown to be routed to an output terminal 104 (RF_out). As shown, the output RF signal can undergo impedance matching by an output matching network 124. The output RF signal can also pass through, for example, a DC-block capacitor C2.

In the example of FIG. 3, the gate of the first FET J0 is shown to be provided with a bias voltage based on a current generated by a current source I3 and passed through a bias resistor R0. The current source I3 is shown to be connected to a supply voltage terminal 130 (VDD) at node 132.

In the description herein, the current source I3 is sometimes referred to as providing or generating a bias voltage.

Such a voltage can be described as having an amplitude or magnitude. Further, such an amplitude or magnitude can be increased or decreased by increasing or decreasing the current generated by the current source I3. In such references between the current source I3 and the bias voltage, as well as in similar contexts, it will be understood that the bias voltage is generally proportional to the current generated by the current source I3.

The gate of the second FET J1 is shown to be biased by the supply voltage VDD at node 138. Further, the drain of the second FET J1 is shown to be isolated, at RF frequency of operation, by an LC circuit that includes a parallel arrangement of an inductance L0 and a capacitance C1 resonated at frequency of operation.

FIG. 3 shows that the LNA circuit 100 can further include an inductance L1 coupled to the source of the first FET J0. Typically, such an inductance (L1) can be connected to a signal ground 156.

FIG. 3 shows that in some embodiments, a switchable inductance circuit 112 can be provided between the source of the first FET J0 and the signal ground 156. In the example shown, the switchable inductance circuit 112 is shown to be implemented between the inductance L1 and the signal ground 156. It will be understood, however, that the order of L1 and the switchable inductance circuit 112 can be reversed along the path between the source of the first FET J0 and the signal ground 156.

The example switchable inductance circuit 112 is shown to include an inductance L2 (e.g., an inductor) connected between nodes 152 and 154. Also connected to the nodes 152 and 154 are two ends of a switch S0, such that the switch S0 and the inductance L2 are electrically parallel. Accordingly, the presence of the inductance L2 along the path between the source of the first FET J0 and the signal ground 156 can be switched in or out. For example, if the switch S0 is closed (e.g., by processing device/controller 113), then the short circuit provided by the closed switch S0 bypasses the inductance L2. In contrast, if the switch S0 is opened (e.g., by processing device/controller 113), the inductance L2 is switched into the path between the source of the first FET J0 and the signal ground 156. Examples of how such switching of the inductance L2 can impact the performance of the LNA 100 are described herein in greater detail.

In some embodiments, the current source I3 can be a variable current source 134. Such a variable current source can be utilized to provide different bias voltages to the first FET J0, depending on whether the inductance L2 is switched in or out. Examples of such different bias voltages are described herein in greater detail.

In FIG. 3, the amplifying transistors 110 are described in the context of a cascode configuration. It will be understood, however, that one or more features of the present disclosure can also be implemented in other types of LNA configurations. It will also be understood that one or more features of the present disclosure can also be implemented in other types of RF amplifiers.

In FIG. 3, the bias circuit 114 is an example bias circuit. It will be understood that other bias circuit configurations can also be utilized to facilitate one or more features of the present disclosure. In some embodiments, such other bias circuit configurations can include a functionality of providing different voltages to an amplifying amplifier; and such different voltages can be provided based on switched inductance states associated with the amplifying amplifier.

In the example configuration of FIG. 3, various components such as resistance(s), capacitance(s), and inductance(s) can be configured and/or be provided with appropriate values for a given operating mode. It will be understood that other values of the various parts, as well as appropriate substitution of parts can also be implemented.

In some wireless device designs, a high linearity mode is required or desired for LNAs, in addition to a normal LNA mode and a receive (Rx) bypass mode. It has been observed that the example LNA circuit of FIG. 3 can be configured and operated to yield increased linearity even with lower current consumption. In some implementations, such an increased linearity can be switched on as needed to satisfy requirements associated with the foregoing high linearity mode.

Figure 4A:
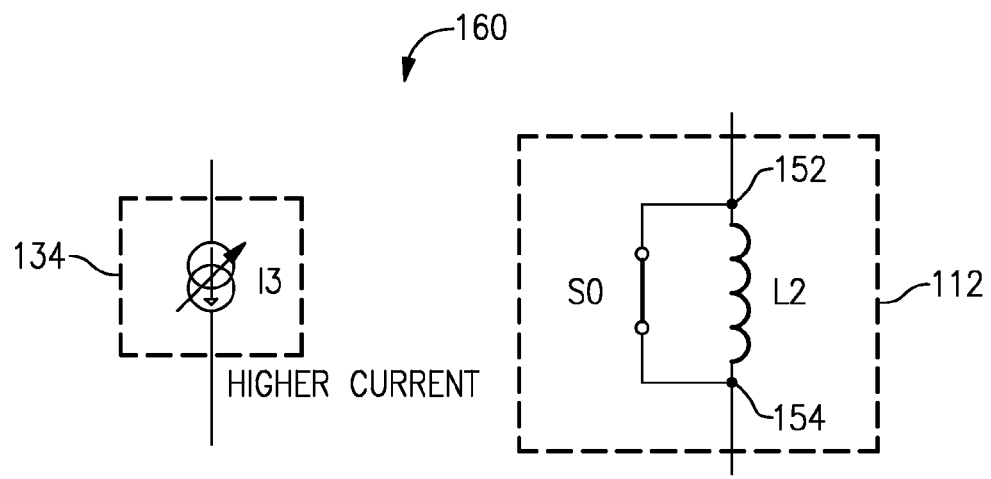
FIGS. 4A and 4B show examples of how the switchable inductance and the variable current source can operate in combination to yield desirable performance of the LNA circuit.

For example, FIG. 4A shows a configuration 160 where the switchable inductance 112 of FIG. 3 has the switch S0 in a closed state. Such a mode can be implemented when the high linearity mode is not needed or desired. In such a mode, the inductance L2 is bypassed by the closed switch S0. Accordingly, the total inductance between the source of the first FET J0 (see FIG. 3) and the signal ground 156 is approximately equal to the inductance L1. In some implementations, the variable current source 134 can be controlled to generate a higher current (and thus a higher bias voltage) than that of the example configuration of FIG. 4B.

Figure 4B:
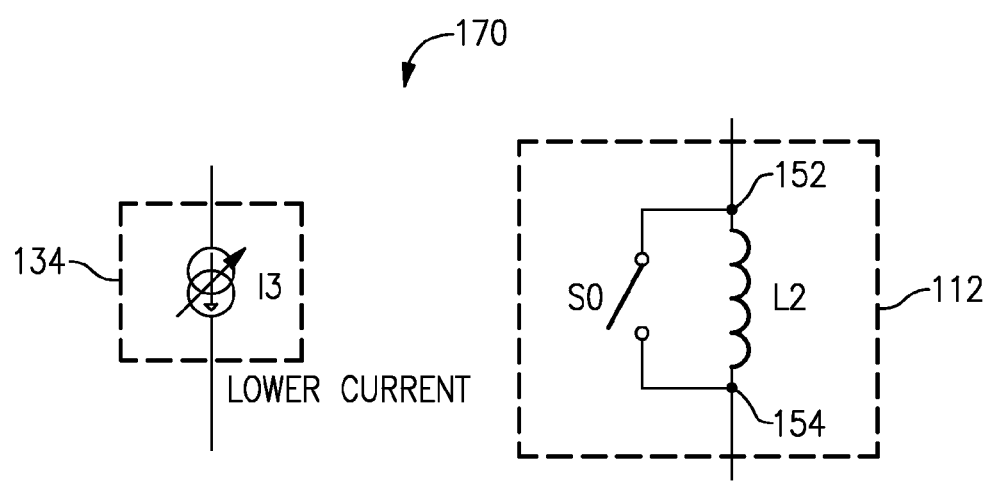

FIG. 4B shows a configuration 170 where the switchable inductance 112 of FIG. 3 has the switch S0 in an open state. Such a mode can be implemented when the high linearity mode is needed or desired. In such a mode, the inductance L2 is inserted in series with the inductance L1. Accordingly, the total inductance between the source of the first FET J0 (see FIG. 3) and the signal ground 156 is approximately equal to the sum of inductance L1 and inductance L2. In some implementations, the variable current source 134 can be controlled to generate a lower current (and thus a lower bias voltage) than that of the example configuration of FIG. 4A. Such a lower bias voltage for the first FET J0 and the increased source inductance to signal ground can allow the LNA to operate in the high linearity mode with desirably reduced power consumption.

It has been observed that with the increased source inductance to signal ground and the decreased bias voltage, linearity performance (e.g., measured in terms of third-order intercept point (IIP3)) of the LNA can easily double (e.g., greater than 3 dB improvement in IIP3) or quadruple (e.g., greater than 6 dB improvement in IIP3), without excessive power dissipation. It is noted that the foregoing technique of increasing the source inductance to signal ground while decreasing the bias voltage consumes considerably less power to meet the high linearity requirements when compared to a typical traditional approach of only increasing the bias voltage.

Other advantageous features have been observed or are expected. For example, relatively high gain can be achieved in the foregoing high linearity mode by utilizing one or more features of the present disclosure. In approaches without such features, improved linearity is typically achieved by sacrificing the gain significantly.

In another example, the relatively high linearity can be achieved without degrading noise figure (NF) performance. In some embodiments, one or more features of the present disclosure can be implemented to possibly improve the NF performance.

In yet another example, LNA designs having one or more features of the present disclosure can be less sensitive to process variations, when compared to approaches without such feature(s).

Table 1 lists comparisons of such parameters for configurations with and without the feature of switchable inductance and current adjustment. The various values are approximate values.

TABLE 1

| | With switchable inductance and current adjustment | | Without switchable inductance and current adjustment |
|---|---|---|---|
| | High linearity mode | High gain mode | |
| IIP3 (dBm) | 10 | 7 | 6 |
| Gain (dB) | 11 | 14 | 14 |
| Current (mA) | 12 | 15 | 18 |
| Vsupply (V) | 2.7 | 2.7 | 2.7 |

To obtain the example results of Table 1, the inductance L1 has a value of approximately 750 pH, the inductance L2 has a value of approximately 550 pH, and the RF signal has a frequency in a range of 2.4 to 2.5 GHz.

Figure 5:
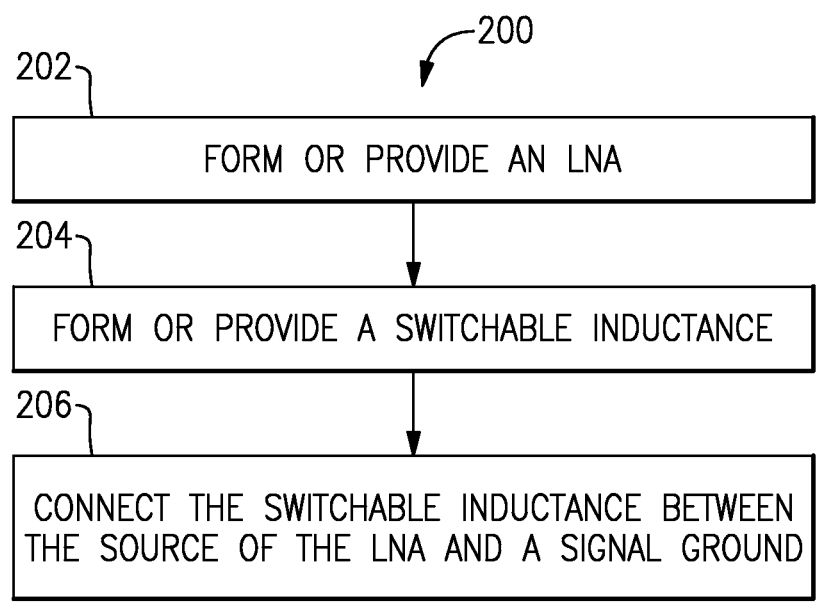
FIG. 5 shows a process that can be implemented to fabricate an LNA circuit having one or more features as described herein.

FIG. 5 shows a process 200 that can be implemented to fabricate an RF amplifier (such as an LNA) device having one or more features as described herein. In block 202, an LNA can be formed or provided. In block 204, a switchable inductance circuit can be formed or provided. In block 206, the switchable inductance circuit can be connected between the source of the LNA and a signal ground.

Figure 6:
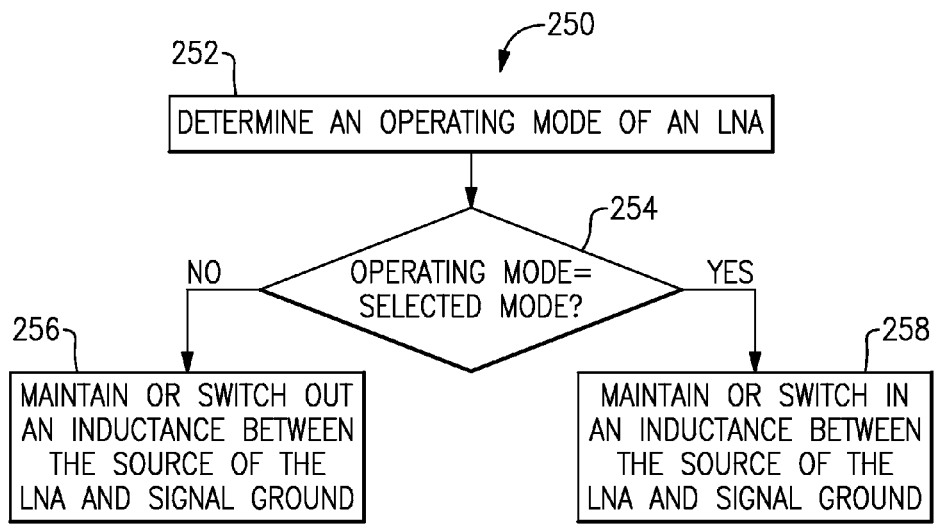
FIG. 6 shows a process that can be implemented to operate an LNA circuit.

FIG. 6 shows a process 250 that can be implemented to operate an RF amplifier (such as an LNA) device having one or more features as described herein. In block 252, an operating mode of an LNA can be determined. In a decision block 254, the process 250 can determine whether the operating mode is a selected mode such as a high linearity mode. If the answer is "No," the process 250 in block 256 can maintain (e.g., if already in a non-selected mode) or switch out (e.g., if in the selected mode) an inductance between the source of the LNA and signal ground. If the answer is "Yes," the process 250 in block 258 can maintain (e.g., if already in the selected mode) or switch in (e.g., if not in the selected mode) an inductance between the source of the LNA and signal ground. In some embodiments, bias voltage provided to the gate of the LNA can be adjusted or maintained accordingly to yield an improved linearity performance when in the high linearity mode.

Figure 7:
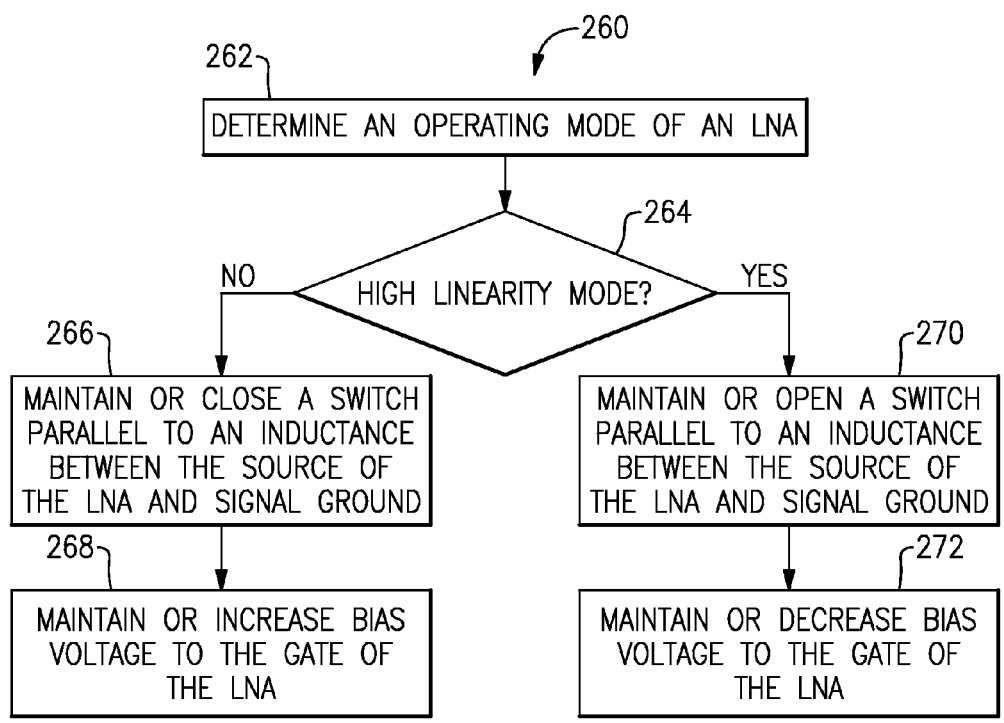
FIG. 7 shows a process that can be a more specific example of the process of FIG. 6.

FIG. 7 shows a process 260 that can be a more specific example of the process 250 of FIG. 6. More particularly, the process 260 can be implemented for a configuration where the switching of inductance involves a parallel arrangement of an inductance and a switch (such as the example of FIGS. 3 and 4), and where the selected mode is a high linearity mode. In block 262, an operating mode of an LNA can be determined. In a decision block 264, the process 260 can determine whether the operating mode is a high linearity mode. If the answer is "No," the process 260 in block 266 can maintain a closed switch (e.g., if already in a normal linearity mode) or close the switch (e.g., if in the high linearity mode) that is parallel to an inductance between the source of the LNA and signal ground. In some implementations, the process 260 in block 268 can further maintain a higher bias voltage (e.g., if already in the normal linearity mode) or increase (e.g., if in the high linearity mode) the bias voltage provided to the gate of the LNA. If the answer is "Yes," the process 260 in block 270 can maintain an open switch (e.g., if already in the high linearity mode) or open the switch (e.g., if not in the high linearity mode) that is parallel to an inductance between the source of the LNA and signal ground. In some implementations, the process 260 in block 272 can further maintain a lower bias voltage (e.g., if already in the high linearity mode) or decrease (e.g., if not in the high linearity mode) the bias voltage provided to the gate of the LNA.

Examples of switchable inductance circuit configurations described herein can be implemented in a number of different ways and at different product levels. Some of such product implementations are described by way of examples.

Figure 8A:
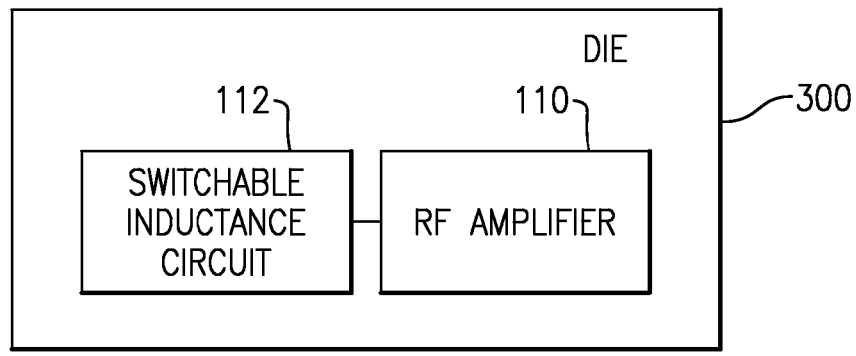
FIGS. 8A-8C show examples of how an LNA circuit having one or more features as described herein can be implemented in products at a die level.
Figure 8B:
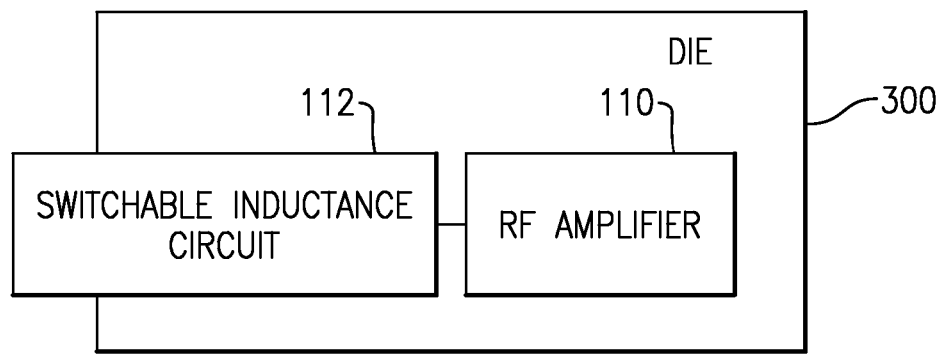
Figure 8C:
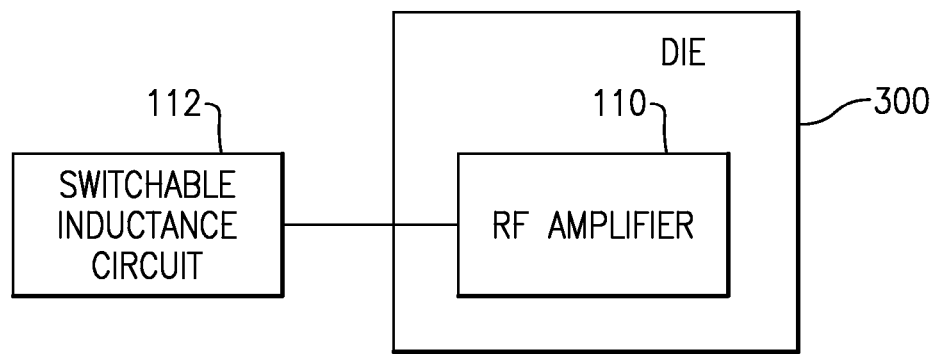

FIGS. 8A-8C schematically show non-limiting examples of such implementations on one or more semiconductor die. FIG. 8A shows that in some embodiments, at least some of a switchable inductance circuit 112 having one or more features as described herein and an RF amplifier 110 can be implemented on a die 300. In some embodiments, such a die can include a silicon-on-insulator (SOI) substrate. Such a die may or may not include an inductance that can be switched in and out. FIG. 8B shows that in some embodiments, at least some of the switchable inductance circuit 112 can be implemented outside of the die 300 associated with the RF amplifier 110. FIG. 8C shows that in some embodiments, a switchable inductance circuit 112 having one or more features as described herein can be implemented substantially outside of the die 300 associated with the RF amplifier 110. Such a switchable inductance circuit may be implemented on another die, on a substrate on which the die 300 is mounted on, or some combination thereof.

Figure 9A:
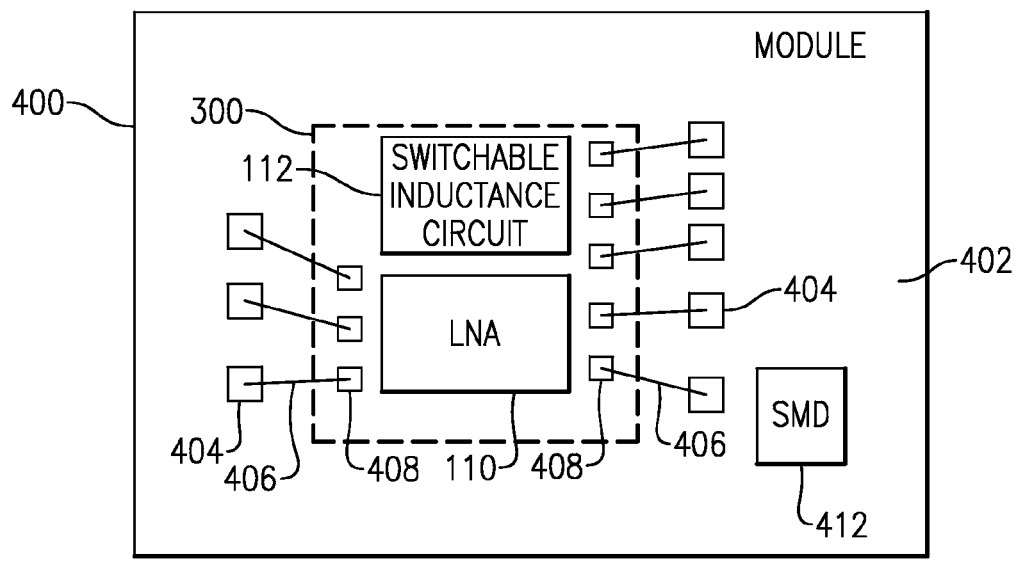
FIGS. 9A and 9B show an example of how an LNA circuit having one or more features as described herein can be implemented in a packaged module.
Figure 9B:
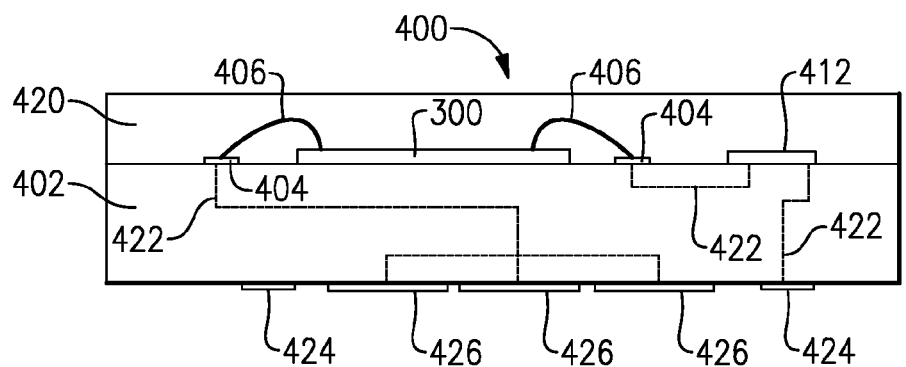

In some embodiments, one or more die having one or more features as described herein can be implemented in a packaged module. An example of such a module is shown in FIGS. 9A (plan view) and 9B (side view). Although described in the context of both of the LNA circuit and the switchable inductance circuit being on the same die (e.g., example configuration of FIG. 8A), it will be understood that packaged modules can be based on other configurations. It will also be understood that although described in the context of an LNA, other types of RF amplifiers can also be implemented on such packaged modules.

A module 400 is shown to include a packaging substrate 402. Such a packaging substrate can be configured to receive a plurality of components, and can include, for example, a laminate substrate. The components mounted on the packaging substrate 402 can include one or more die. In the example shown, a die 300 having an LNA 110 and a switchable inductance circuit 112 is shown to be mounted on the packaging substrate 402. The die 300 can be electrically connected to other parts of the module (and with another die where more than one die is utilized) through connections such as connection-wirebonds 406. Such connection-wirebonds can be formed between contact pads 408 formed on the die 300 and contact pads 404 formed on the packaging substrate 402. In some embodiments, one or more surface mounted devices (SMDs) 412 can be mounted on the packaging substrate 402 to facilitate various functionalities of the module 400. Although described in the context of wirebond-based connectivity, it will be understood that the die 300 can be implemented to allow other types of electrical connections. For example, the die 300 can be implemented as a wafer level chip scale package (WLCSP), with or without redistribution layer (RDL) connection, that does not require connection-wirebonds. Such a WLCSP device can be configured to be mounted on an appropriately configured packaging substrate such as a laminate substrate.

In some embodiments, the packaging substrate 402 can include electrical connection paths for interconnecting the various components with each other and/or with contact pads for external connections. For example, a connection path 422 is depicted as interconnecting the SMD 412 with an external-connection contact pad 424. In yet another example a connection path 422 is depicted as interconnecting the die 300 with ground-connection contact pads 426.

In some embodiments, a space above the packaging substrate 402 and the various components mounted thereon can be filled with an overmold structure 420. Such an overmold structure can provide a number of desirable functionalities, including protection for the components and wirebonds from external elements, and easier handling of the packaged module 400.

In some implementations, some of the example wirebonds 406 can be utilized to provide inductance. Thus, in some embodiments, one or more of such wirebonds 406 can be connected with one or more switches to provide the switchable inductance functionality as described herein.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 10:
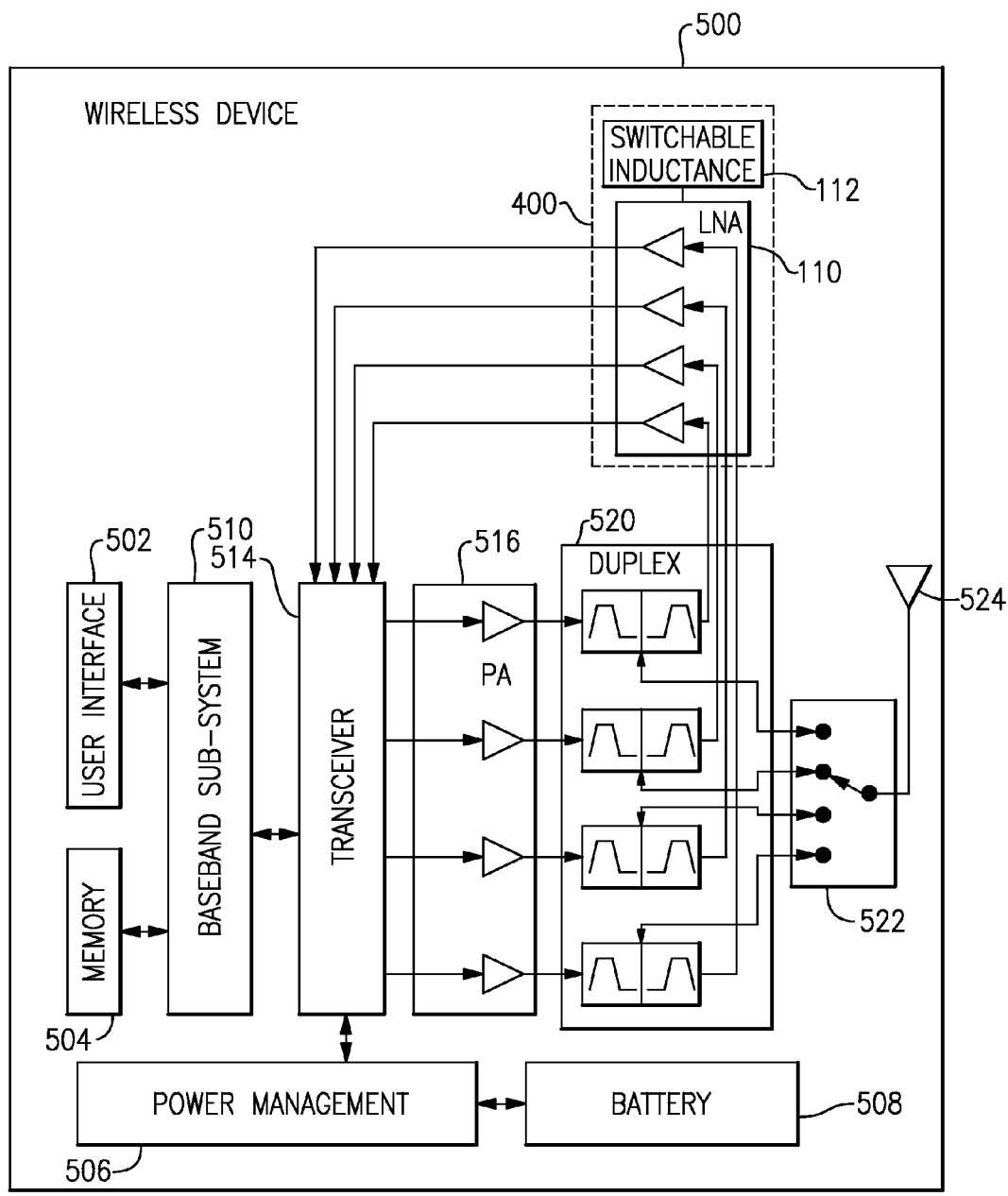
FIG. 10 shows an example of a wireless device having one or more features as described herein.

FIG. 10 schematically depicts an example wireless device 500 having one or more advantageous features described herein. In the context of LNA and switchable inductance circuit configurations as described herein, one or more LNAs 110 and their corresponding switchable inductance circuit(s) 112 can be part of a module 400.

In the example wireless device 500, a power amplifier (PA) module 516 having a plurality of PAs can provide an amplified RF signal to a switch 522 (via a duplexer 520), and the switch 522 can route the amplified RF signal to an antenna 524. The PA module 516 can receive an unamplified RF signal from a transceiver 514 that can be configured and operated in known manners.

The transceiver 514 can also be configured to process received signals. Such received signals can be routed to the LNA(s) 110 from the antenna 524, through the duplexer 520. Various operations of the LNA(s) 110 can be facilitated by the switchable inductance circuit 112 as described herein.

The transceiver 514 is shown to interact with a baseband sub-system 510 that is configured to provide conversion between data and/or voice signals suitable for a user and RF signals suitable for the transceiver 514. The transceiver 514 is also shown to be connected to a power management component 506 that is configured to manage power for the operation of the wireless device 500. Such a power management component can also control operations of the baseband sub-system 510 and the module(s) 400.

The baseband sub-system 510 is shown to be connected to a user interface 502 to facilitate various input and output of voice and/or data provided to and received from the user. The baseband sub-system 510 can also be connected to a memory 504 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation (s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) amplifier circuit comprising:
   a first amplifying transistor configured to amplify an RF signal;
   a switchable inductance circuit that couples the first amplifying transistor to a signal ground, the switchable inductance circuit configured to be capable of having a selected one of a plurality of different inductance values that yield different linearity levels for the RF amplifier circuit; and
   a processing device configured to determine a linearity mode of the RF amplifier circuit and to control the switchable inductance circuit to have the selected one of the plurality of different inductance values based on the determined linearity mode.

2. The circuit of claim 1 wherein the first amplifying transistor includes a source, a drain and a gate, the first amplifying transistor configured to receive the RF signal at the gate and output the amplified RF signal at the drain.

3. The circuit of claim 2 wherein the switchable inductance circuit couples the source of the first amplifying transistor to the signal ground.

4. The circuit of claim 1 wherein the RF amplifier circuit is a low-noise amplifier (LNA) circuit.

5. The circuit of claim 1 wherein the switchable inductance circuit includes a first inductance connected electrically parallel with a switch, the processing device being configured to set the switch in a closed state or an open state to control the switchable inductance circuit to have a first one of the plurality of different inductance values or a second one of the plurality of different inductance values based on the determined linearity mode.

6. The circuit of claim 5 further comprising a second inductance connected in series with the switchable inductance circuit such that an overall inductance between the source of the first transistor and the signal ground is approximately equal to the second inductance when the switch is in the closed state and approximately equal to a sum of the first and second inductances when the switch is in the open state.

7. The circuit of claim 6 wherein the first inductance and the second inductance are selected so that the RF amplifier circuit operates in a normal linearity mode when the switch is in the closed state and a high linearity mode when the switch is in the open state.

8. The circuit of claim 1 further comprising a bias circuit, the bias circuit including a variable current source configured to provide a bias voltage to the first amplifying transistor.

9. The circuit of claim 8 wherein the bias voltage has a first magnitude when the RF amplifier circuit operates in a normal linearity mode and a second magnitude when the RF amplifier circuit operates in a high linearity mode.

10. The circuit of claim 9 wherein the second magnitude of the bias voltage is lower than the first magnitude of the bias voltage.

11. The circuit of claim 10 wherein the RF amplifier circuit consumes less power in the high linearity mode than in the normal linearity mode due to the second magnitude of the bias voltage being lower than the first magnitude of the bias voltage.

12. The circuit of claim 3 further comprising a second amplifying transistor coupled to the drain of the first transistor, the first amplifying transistor and the second amplifying transistors being connected and operated in a cascode configuration.

13. The circuit of claim 12 wherein each of the first amplifying transistor and the second amplifying transistor is a field-effect transistor (FET).

14. A method for operating a radio-frequency (RF) amplifier circuit, the method comprising:
providing an RF signal to a transistor of the RF amplifier circuit to amplify the RF signal;
determining a linearity mode of the RF amplifier circuit; and
performing a switching operation based on the determined linearity mode that results in an inductance to change among a plurality of different inductance values between the transistor and a signal ground, the plurality of different inductance values yielding different linearity levels for the RF amplifier circuit.

15. The method of claim 14 further comprising adjusting a bias voltage provided to the transistor to yield a selected bias voltage for each of the plurality of different inductance values.

16. The method of claim 15 wherein a higher linearity level corresponds to an increased inductance value of the plurality of different inductance values and a decreased bias voltage of the selected bias voltages.

17. The method of claim 16 wherein the increased inductance value and the decreased bias voltage results in the RF amplifier circuit consuming less power at the higher linearity level.

18. A radio-frequency (RF) module, comprising:
a packaging substrate configured to receive a plurality of components;
a low-noise amplifier (LNA) implemented on a die, the die mounted on the packaging substrate, the LNA including a transistor configured to amplify an RF signal;
a switchable inductance circuit that couples the transistor to a signal ground, the switchable inductance circuit configured to be capable of having a selected one of a plurality of different inductance values that yield different linearity levels for the LNA; and
a processing device configured to determine a linearity mode of the LNA and to control the switchable inductance circuit to have the selected one of the plurality of different inductance values based on the determined linearity mode.

19. The module of claim 18 wherein at least a portion of the switchable inductance circuit is also implemented on the die.

20. The module of claim 18 wherein the die includes a silicon-on-insulator (SOI) substrate.

* * * * *